(12) United States Patent
Laraia

(10) Patent No.: US 6,882,513 B2
(45) Date of Patent: Apr. 19, 2005

(54) INTEGRATED OVERVOLTAGE AND REVERSE VOLTAGE PROTECTION CIRCUIT

(75) Inventor: J. Marcos Laraia, Pocatello, ID (US)

(73) Assignee: AMI Semiconductor, Inc., Pocatello, ID (US)

( * ) Notice: Subject to any disclaimer, the term of this patent is extended or adjusted under 35 U.S.C. 154(b) by 229 days.

(21) Appl. No.: 10/243,749

(22) Filed: Sep. 13, 2002

(65) Prior Publication Data

US 2004/0052022 A1 Mar. 18, 2004

(51) Int. Cl.$^7$ ................................................. H02H 3/00
(52) U.S. Cl. ..................................... 361/91.1; 361/84
(58) Field of Search ........................... 361/91.1, 84, 82, 361/115; 257/360

(56) References Cited

U.S. PATENT DOCUMENTS

| | | | | |
|---|---|---|---|---|
| 4,213,046 A | * | 7/1980 | Beyersdorf | ................ 250/381 |
| 4,857,985 A | | 8/1989 | Miller | ........................ 357/42 |
| 5,413,072 A | * | 5/1995 | Andersen et al. | ....... 123/145 A |
| 5,539,610 A | | 7/1996 | Williams et al. | ............ 361/246 |
| 5,585,991 A | | 12/1996 | Williams | ..................... 361/30 |
| 5,642,251 A | * | 6/1997 | Lebbolo et al. | ............... 361/84 |
| 5,695,886 A | * | 12/1997 | Dewan et al. | ................. 429/7 |
| 5,757,600 A | | 5/1998 | Kiraly | ......................... 361/84 |
| 5,781,390 A | | 7/1998 | Notaro et al. | ................ 361/84 |
| 6,043,965 A | | 3/2000 | Hazelton et al. | ............. 361/84 |
| 6,218,819 B1 | * | 4/2001 | Tiwari | ....................... 323/285 |
| 6,628,489 B1 | * | 9/2003 | Pardoen et al. | .............. 361/84 |

* cited by examiner

Primary Examiner—Brian Sircus
Assistant Examiner—Z Kitov
(74) Attorney, Agent, or Firm—Workman Nydegger

(57) ABSTRACT

An integrated overvoltage and reverse voltage protection circuit. The protection circuit includes a field-effect transistor having a source terminal coupled to an input terminal of the protection circuit, and a drain terminal coupled to an output terminal of the protection circuit. A resistor is coupled between the source terminal and the body terminal of the field-effect transistor to inhibit reverse current flow during a reverse voltage condition. A voltage-current dependent circuit is coupled between the gate terminal and the source terminal of the field-effect transistor, and is configured to apply a voltage between the gate terminal and the source terminal that is dependent on the current passing through the voltage-current dependent circuit. A current application circuit is coupled to the voltage-current dependent circuit and is configured to apply a current that limits or even altogether stops an applied overvoltage condition from reaching a load circuit.

19 Claims, 6 Drawing Sheets

INTEGRATED OVERVOLTAGE AND REVERSE VOLTAGE PROTECTION CIRCUIT

BACKGROUND OF THE INVENTION

1. The Field of the Invention

The present invention relates generally to electrical power protection circuits. More specifically, the present invention relates to integrated overvoltage and reverse voltage protection circuits.

2. Background and Related Art

Electrical circuits are in widespread use with a practically limitless variety of applications. Innovation in circuit design has changed the very way we live and work. Nevertheless, there are limits to electrical circuitry. One limit is that circuitry is only designed to operate with certain applied electrical voltages. If those supplied electrical voltages should vary from the designed electrical voltage conditions, circuitry may be damaged or destroyed. Such damage or destruction is most often undesired and may often even be unacceptable. Accordingly, various electrical protection circuits have been developed.

The purpose of such protection circuits is to ensure that a load electrical circuit is protected from anomalous applied electrical conditions. Some protection circuits substantially stop any power at all from being delivered to the load circuit if anomalous voltage conditions are applied to the protection circuit. One class of protection circuits called voltage regulators control the supplied voltage such that useful voltages are applied to the load circuit despite anomalous voltages being applied to the protection circuit. Voltage regulators are especially useful when it is necessary for the load circuit to continue to operate despite excessive applied supply voltages.

One application in which anomalous applied voltages may occur is in the automotive environment in which a battery supplies power to circuitry throughout the vehicle. In many cases, the vehicle circuitry is not powered directly from the battery. Instead, the vehicle circuitry is powered by a regulator that lowers the battery voltage and smoothes out the transients in the battery voltage. For example, a typical regulator may receive a battery voltage of up to approximately 16 volts and use that voltage to generate a regulator voltage of just 5 volts.

It is not usual in such a vehicle to have the vehicle circuitry experience transient surges of excessive voltages. Protection from such excessive voltages is often termed "overvoltage protection." Excessive voltage may occur in a vehicle, for example, when the vehicle circuitry, which is supposed to be supplied by a lower regulated voltage, is directly connected to a battery, which characteristically supplies a much higher voltage. Excessive voltage may also occur in what is called a "double-battery condition" in which two batteries are wrongly connected in series instead of in parallel during a jump-start. This double-battery condition can raise the supplied voltage up to the range from 25 to 30 volts. Yet another type of overvoltage is called "load dump" which occurs when the load current in a vehicle alternator is interrupted. Voltages in the range of 40 to 80V can be generated under the load dump condition.

Also, sometimes the battery may be inadvertently connected in reverse, in which case the load circuitry may be subject to applied electrical voltages that have opposite polarity as compared to the designed applied voltages. Without protection, this may result in normally reverse-biased PN semiconductor junctions to be forward-biased, which can devastate semiconductor-based circuitry. Protection from such reverse power voltages is often called "reverse voltage protection." Overvoltage and reverse voltage conditions, while common in automotive applications, may occur with significant regularity in other applications as well.

Accordingly, protection circuits have been developed to act as a buffer between an applied supply voltage and the load circuitry such that when anomalous supply voltages occur, the anomalous supply voltage is either blocked from reaching the load circuitry entirely, or else the anomalous supply voltage is regulated such that the voltage applied to the load circuitry is appropriate. It is advantageous to have such protection circuits be integrated (e.g., on the same semiconductor die) as the load circuit being protected. This reduces the cost, size and power requirements of the combination of the protection and load circuits, and also provides for improved performance through better device matching.

Some protection circuits are designed for reverse voltage protection, while others are designed for overvoltage protection. Integrating such functionality into a single circuit would result in a smaller design than a combination of non-integrated reverse voltage and overvoltage protection circuits.

In addition, many protection circuits use depletion mode transistors (normally on) or devices such as bipolar transistors, Schottky diodes, or other types of devices that also may not be available in many standard Complementary Metal-Oxide-Silicon (CMOS) processes. Even if available, the process complexity involved with fabricating such devices is high. Thus, the presence of such devices increases the cost of the circuit. Also, such devices may significantly increase the voltage drop across the protection circuit even if the applied supply voltages are within the designed tolerances of the load circuit.

Many protection circuits also may require oscillators, charge pumps, DC-DC converters, or other complex circuits that may significantly increase the cost, size and power dissipation of the protection circuit.

Therefore, what is desired are overvoltage protection circuits that may have integrated reverse voltage protection functionality incorporated therein, and which may be suitable for integration with the load circuit being protected. It would also be advantageous if the protection circuit had a smaller design that did not require complex circuitry or devices that are difficult to fabricate using standard CMOS processes, and which reduce the voltage drop across the protection circuit when normal supply voltages are applied.

SUMMARY OF THE INVENTION

In accordance with the present invention, an integrated overvoltage and reverse voltage protection circuit is configured to provide an output voltage during operation from a voltage supply. If the voltage supplied by the voltage supply is an overvoltage condition, then the protection circuit may either stop any of the applied voltage from reaching a connected load, or may regulate the applied voltage to be within operating tolerances of the connected load.

The protection circuit includes a field-effect transistor having a gate terminal, a source terminal, a drain terminal, and a body terminal, the source terminal of the field-effect transistor being coupled to an input terminal of the protection circuit, the drain terminal of the field-effect transistor being coupled to an output terminal of the protection circuit. A resistor is coupled between the source terminal and the body terminal of the field-effect transistor. A voltage-current dependent circuit is coupled between the gate terminal and the source terminal of the field-effect transistor, the voltage-current dependent circuit configured to apply a voltage difference between the gate terminal and the source terminal that is dependent on the current passing through the voltage-current dependent circuit. A current application circuit is coupled to the voltage-current dependent circuit and is configured to apply a current through the voltage-current dependent circuit such that in at least some conditions when an overvoltage is not present, the voltage-current dependent circuit applies a voltage at the gate terminal of the field-effect transistor sufficient to turn or keep the field-effect transistor on. During reverse operating conditions, the resistor inhibits reverse current flow through the PN junctions of the field-effect transistors.

Additional features and advantages of the invention will be set forth in the description which follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

In order to describe the manner in which the above-recited and other advantages and features of the invention can be obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE INVENTION

The present invention relates to protection circuits that integrate overvoltage protection with reverse voltage detection. The protection circuit has two input terminal for receiving a differential voltage, and two output terminals for applying a differential voltage to a load. The protection circuit prevents an overvoltage or a reverse voltage condition from being applied to the load, even if that condition is applied to the protection circuit.

Figure 1:
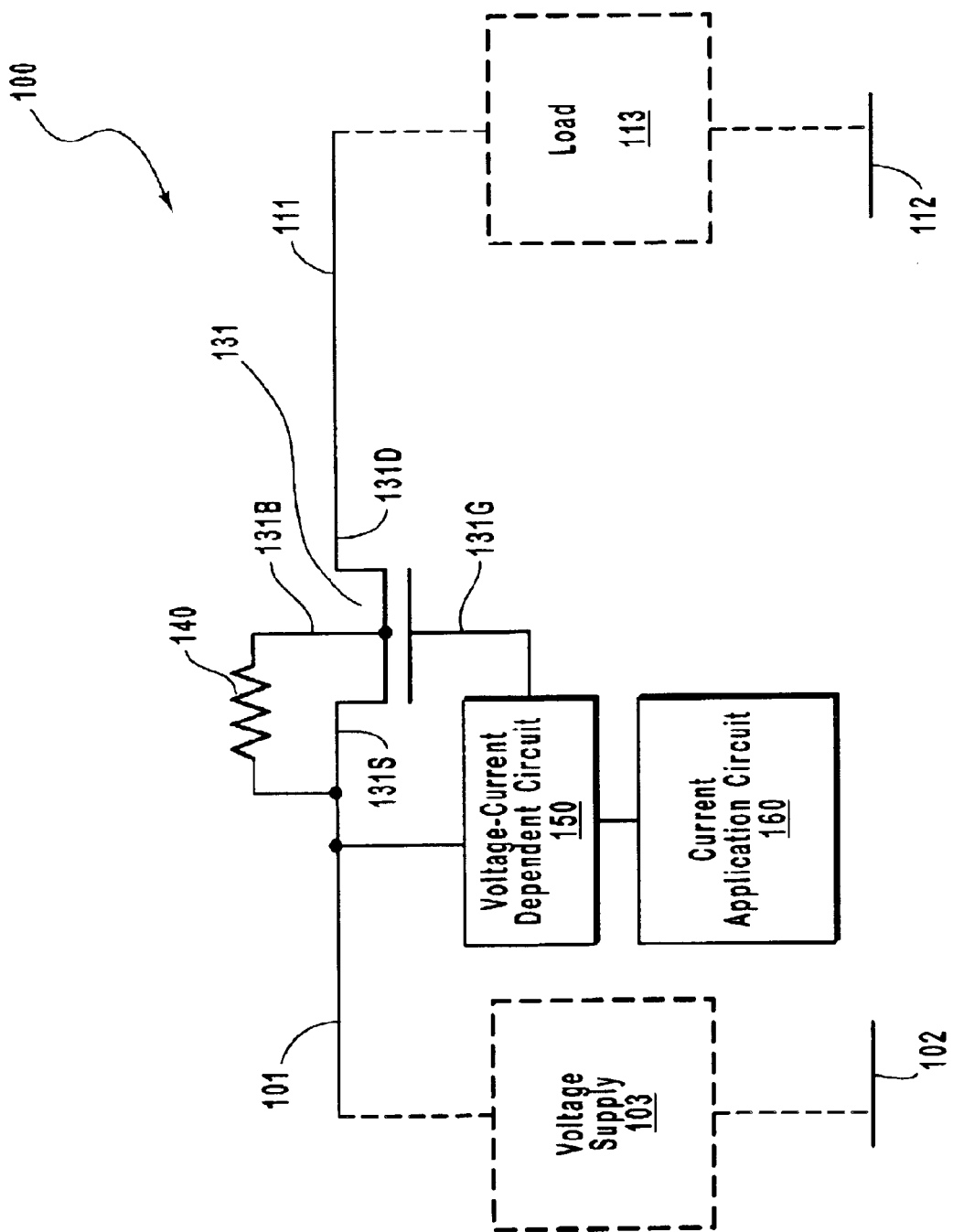
FIG. 1 illustrates a general embodiment of a protection circuit in accordance with the principles of the present invention.

FIG. 1 illustrates a general embodiment of the present invention in the form of a protection circuit 100. The protection circuit 100 includes two input terminals 101 and 102 as well as two output terminals 111 and 112. Although the input terminals and output terminals may be viewed as being differential mode, one of the input terminals or output terminals may, in fact, be ground. Accordingly, the protection circuit 100 may include be viewed as being single-ended on either or both of the input and output sides.

During operation, the protection circuit 100 may be coupled to receive a voltage differential between its input terminals 101 and 102. This voltage differential may be supplied from voltage supply 103. During operation, the voltage differential at the output terminals 111 and 112 of the protection circuit 100 is applied to load 113. The voltage supply 103 and the load 113 are illustrated in dashed-line form to emphasize that the voltage supply 103 and the load 113 may be present during operation as part of the functional environment of the protection circuit 100, but is not necessarily as part of the protection circuit 100 itself. However, one of the advantages of the circuit 100 and other circuits in accordance with the present invention is that the protection circuit may be fabricated on the same chip as the load being protected thus preserving cost, space and power requirements. Accordingly, the protection circuit 100 may be integrated on the same chip containing the load 113.

The protection circuit 100 is structured to protect the load 113 from anomalous voltage differentials applied at the input terminals 101 and 102 of the protection circuit 100. Such anomalous voltage differentials may include overvoltage conditions as well as reverse voltage conditions. The general structure of the protection circuit 100 that enables such protection will now be described. Various specific structural examples will also be described with respect to figures subsequent to FIG. 1.

The protection circuit 100 includes a field effect transistor 131 that includes a gate terminal 131G, a source terminal 131S, a drain terminal 131D, and a body terminal 131B. The source terminal 131S of the field-effect transistor 131 is coupled to the input terminal 101 of the protection circuit 100. The drain terminal 131D of the field-effect transistor 131 is coupled to the output terminal 111 of the protection circuit. The field-effect-transistor may be a Metal-Oxide-Silicon Field-Effect Transistor (also called a "MOSFET") although the present invention is not limited to implementation on a silicon semiconductor material.

A resistor 140 is coupled between the source terminal 131S and the body terminal 131B of the field-effect transistor 131. During reverse voltage conditions, the resistor 140 restricts the amount of current flowing in reverse through the transistor 131 from the output terminal 111 to the input terminal 101. The higher the resistance, the greater the reduction in potentially harmful reverse current during reverse voltage conditions. While all materials have some built-in parasitic resistance, the resistor 140 is an actual, not parasitic, circuit element that preferably has a resistance of at least one or two kiloohms, although higher resistances will further inhibit reverse current. The desired size of the resistor may be obtained by balancing the benefit of reduced current associated with a higher resistance with the detriment of increased space usage of resistors having higher resistances.

A voltage-current dependent circuit 150 is coupled between the gate terminal 131G and the source terminal 131S of the field-effect transistor. The voltage-current dependent circuit 150 is configured to apply a voltage difference between the gate terminal and the source terminal that is dependent on the current passing through the voltage-current dependent circuit 150. Examples of voltage-current dependent circuits include resistors, diodes, and the channel regions of field-effect transistors operating in the triode region or even in the saturation region.

A current application circuit 160 is coupled to the voltage-current dependent circuit 150. The current application circuit 160 is configured to apply a current through the voltage-current dependent circuit 150 such that in at least some conditions when an overvoltage is not present at the input terminals 101 and 102, the voltage-current dependent circuit applies a voltage at the gate terminal 131G of the field-effect transistor 131 that is sufficient to turn or keep (as the case may be) the field-effect transistor 131 on. The current application circuit 160 may include comparators, amplifiers, field-effect transistors or other components in order to accomplish this. FIGS. 2A through 2D, 3A through 3D and FIG. 4 illustrates various specific embodiments of the protection circuit 100. These specific embodiments will now be described.

In each of FIGS. 2A through 2D, the field-effect transistor 131 comprises a p-type field-effect transistor 231. In addition, the voltage-current dependent circuit 150 comprises a resistor 250 coupled between the source and gate terminals of the p-type field-effect transistor 231. A diode 280 is also illustrated to model the parasitic diode electrical characteristics between the drain and body regions of the p-type field-effect transistor 231. In each of FIGS. 2A through 2D, the current application circuit 160 comprises, among other elements, an n-type field-effect transistor 281. The voltage supplied to the input terminal 101 are normally relatively high compared to the input terminal 102 (unless a reverse voltage condition is applied) for each of FIGS. 2A through 2D. The remaining elements of FIGS. 2A through 2D differ, and thus the remaining elements will now be described with references to specific figures.

Figure 2B:
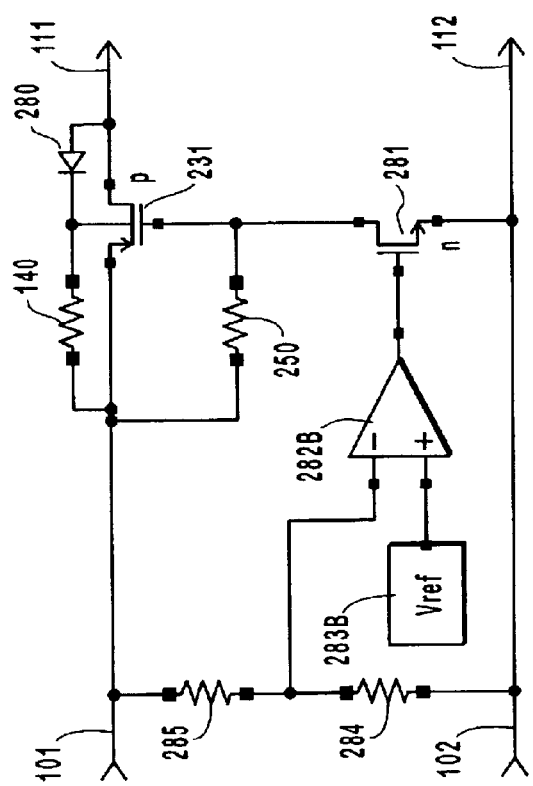
FIG. 2B illustrates a specific embodiment of a protection circuit that is similar to the protection circuit of FIG. 2A, except that the reference voltage is compared to a voltage that is drawn by voltage division from a pair of resistors that are connected in series between the two input terminals of the protection circuit, instead of being drawn directly from the high supply voltage input.
Figure 2A:
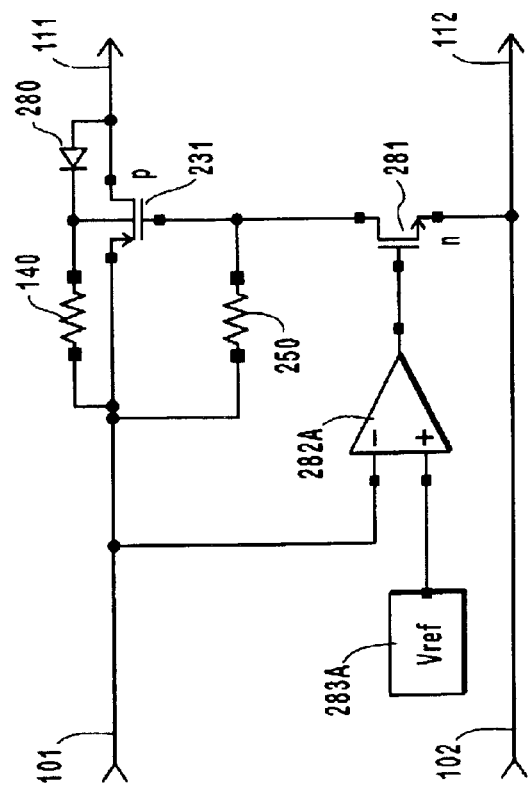
FIG. 2A illustrates a specific embodiment of a protection circuit in which a pMOSFET transistor is used to pass a high supply voltage, and in which a comparator supplied with a reference voltage is used to bias the gate of the pMOSFET transistor via another MOSFET transistor.

In FIG. 2A, the current application circuit 160 comprises a comparator 282A having one input terminal coupled to a voltage reference 283A, and having the other input terminal coupled to the input terminal 101 of the protection circuit. The circuit of FIG. 2A is designed such that if the input voltage applied between the input terminals 101 and 102 of the protection circuit 100 exceeds the reference voltage, then the voltage supply 103 is blocked from the load 113. Should an overvoltage condition be applied by the voltage supply 103, the output from the comparator 282A will be low. This will turn n-type field-effect transistor 281 off, thereby halting any significant current flow through resistor 250. Accordingly, the gate and source terminals of the p-type field-effect transistor 231 will be at the same voltage. Hence, the p-type field-effect transistor 231 is off.

Should a reverse voltage condition be applied to the circuit of FIG. 2A (or any of the embodiments of FIGS. 2A through 2D for that matter), then the resistor 140 will limit the current that passes in reverse from the drain terminal to the source terminal of the p-type field-effect transistor 231. Accordingly, the circuit of FIG. 2A provides both overvoltage and reverse voltage protection in one single integrated circuit.

In FIG. 2B, the current application circuit 160 comprises a comparator 282B having one input terminal coupled to a voltage reference 283B, and having the other input terminal coupled a node in the circuit that is proportional to the input voltage. Resistors 284 and 285 are coupled in series between the input terminals 101 and 102 of the protection circuit 100. Here, the threshold voltage above which overvoltage protection is triggered is equal to the reference voltage times the ratio of the total resistance of resistors 284 and 285 over the resistance of the resistor 284 as will be apparent using simple voltage division. The circuit of FIG. 2B functions similar to the circuit of FIG. 2A, except that the reference voltage of FIG. 2B may be much lower. Accordingly, it is more likely that on-chip voltages may be used as the reference voltage without requiring supplemental circuitry such as charge pumps.

Figure 2D:
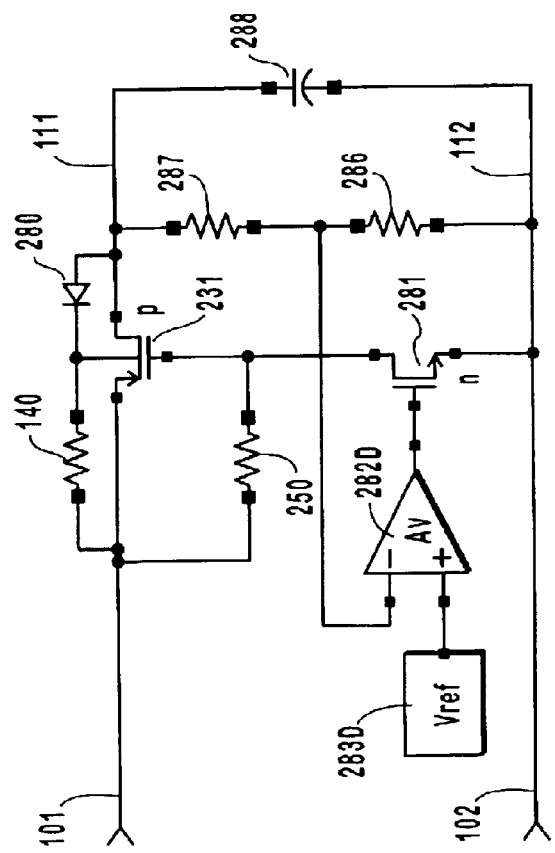
FIG. 2D illustrates a specific embodiment of a protection circuit that is similar to the protection circuit of FIG. 2B, except that an operational amplifier is used instead of a comparator.
Figure 2C:
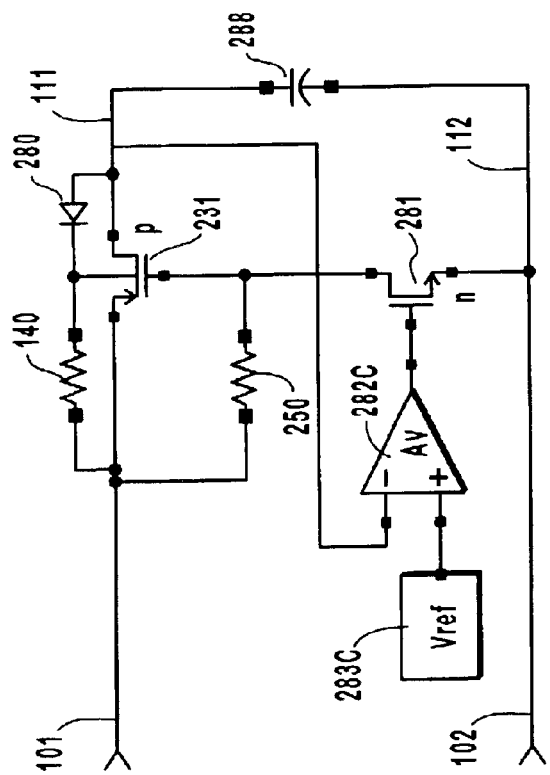
FIG. 2C illustrates a specific embodiment of a protection circuit that is similar to the protection circuit of FIG. 2A, except that an operational amplifier is used instead of a comparator.
Figure 3A:
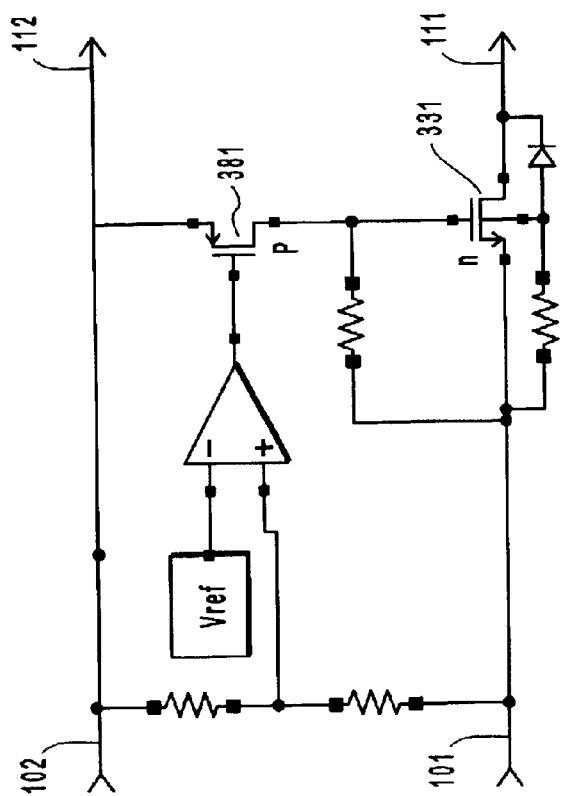
FIG. 3A illustrates a specific embodiment of a protection circuit in which an nMOSFET is used to pass voltages from the low voltage input, instead of the pMOSFET being used to pass voltages from the high voltage input.
Figure 3B:
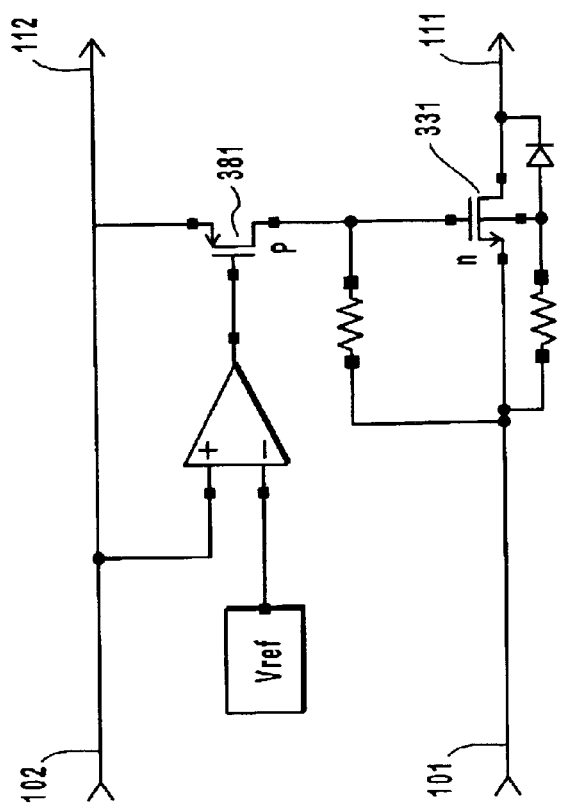
FIG. 3B illustrates a specific embodiment of a protection circuit in which an nMOSFET is used to pass voltages from the low voltage input.
Figure 3D:
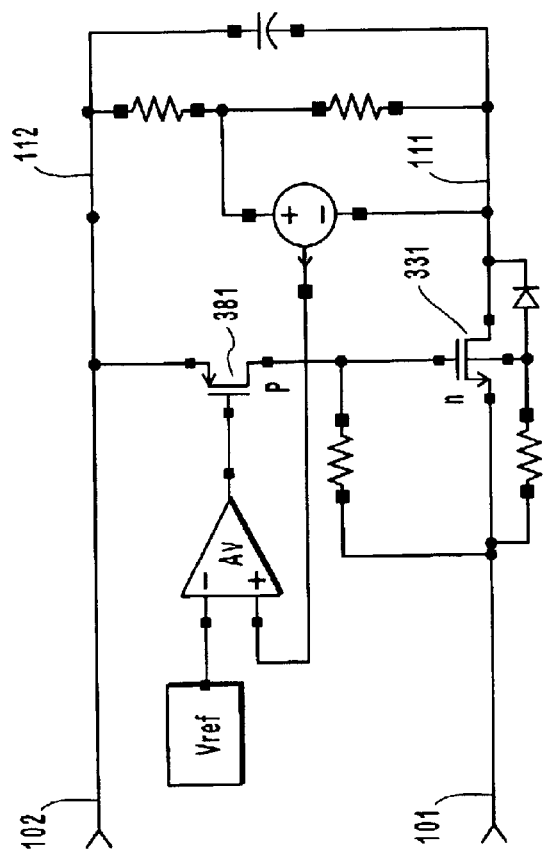
FIG. 3D illustrates a specific embodiment of a protection circuit in which an nMOSFET is used to pass voltages from the low voltage input.
Figure 3C:
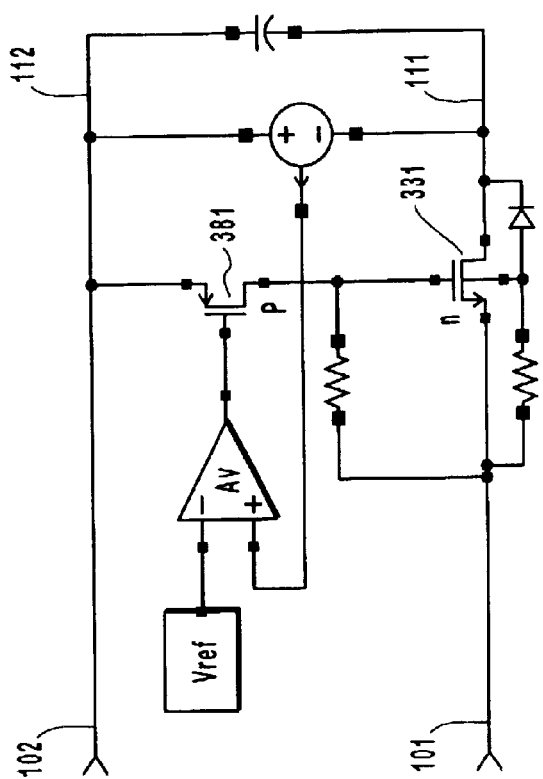
FIG. 3C illustrates a specific embodiment of a protection circuit in which an nMOSFET is used to pass voltages from the low voltage input.

In FIG. 2C, the current application circuit 160 comprises an amplifier 282C that has one input terminal coupled to a voltage reference 283C, and having the other input terminal coupled to the output terminal 111 of the protection circuit 100. The feedback loop created by this connection ensures that during an overvoltage condition, the voltage applied to the gate terminal of the p-type transistor 231 is sufficient that the reference voltage is applied to the output terminal 111 despite the overvoltage condition. For stability and noise filtering purposes, a capacitor 288 is coupled between the output terminals 111 and 112 of the protection circuit 100.

In FIG. 2D, the current application circuit 160 is similar to that illustrated in FIG. 2C, except the second input terminal of the operational amplifier 282D is coupled to an intermediary node between two resistors 286 and 287 that are coupled in series between the output terminals 111 and 112 of the protection circuit 100. Like the circuit of FIG. 2B, the circuit of FIG. 2D may use a lower reference voltage than the circuit of FIG. 2C due to the application of voltage division.

The circuits of FIGS. 3A through 3D are similar to the circuit of FIGS. 2A through 2D, except that the voltage supplied to the input terminal 101 are normally relatively low compared to the input terminal 102 (unless a reverse voltage condition is applied) for each of FIGS. 3A through 3D. In addition, the p-type field-effect transistor 231 is replaced with an n-type field-effect transistor 331. Furthermore, the n-type field-effect transistor 281 is replaced with a p-type field-effect transistor 381. During a reverse bias condition, the resistor between the body and source terminals of the transistor 331 limits current that flows from the source terminal to the drain terminal of the n-type field-effect transistor 331 for each circuit of FIGS. 3A through 3D. During overvoltage conditions, the circuits of FIGS. 3A through 3D will operate in an analogous manner as described above for FIGS. 2A through 2D, respectively, as will be apparent to one of ordinary skill in the art after having read this description. Accordingly, the circuits of FIGS. 2A through 2D and FIGS. 3A through 3D protect a single integrated circuit that provides protection for both overvoltage and reverse voltage conditions.

Figure 4:
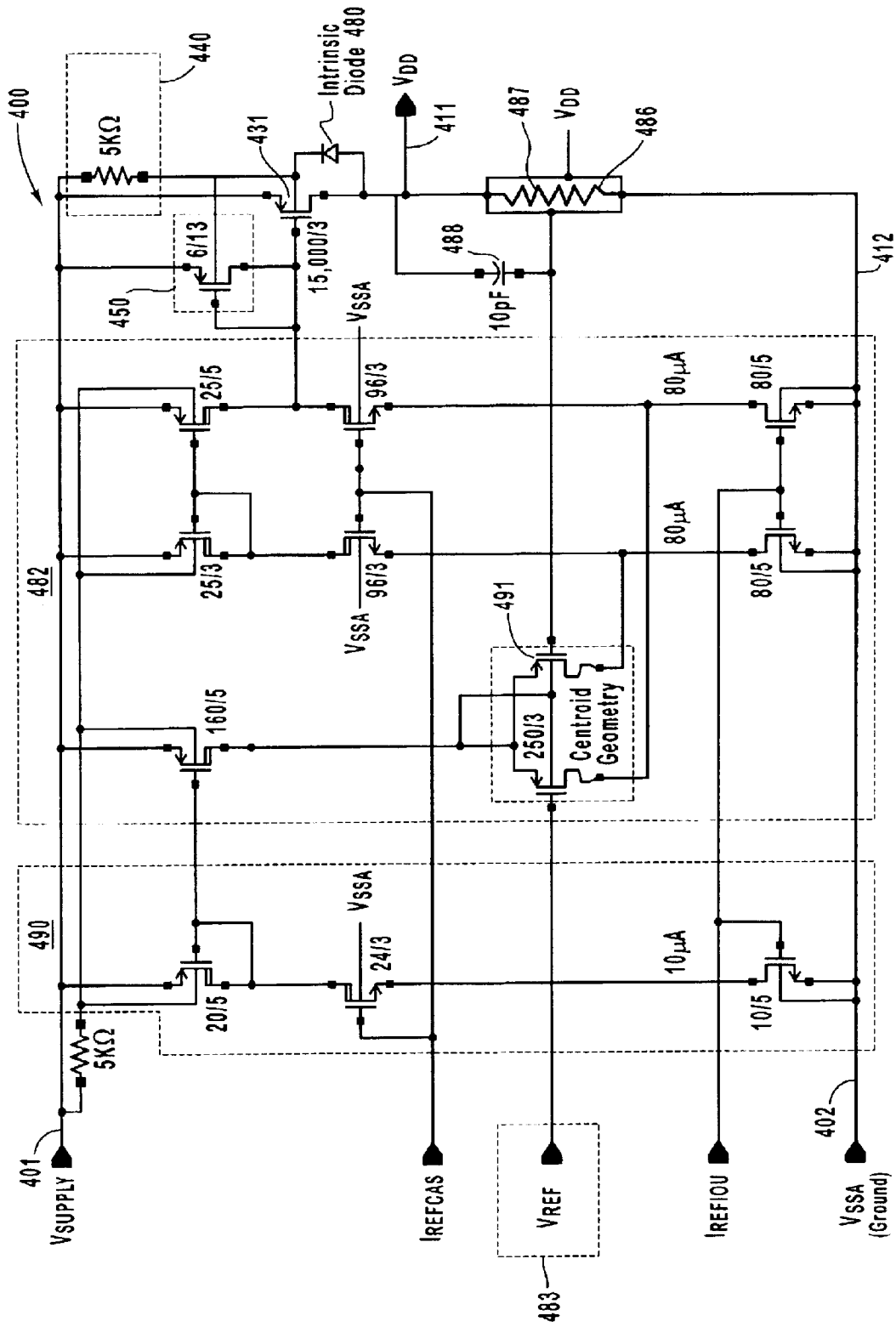
FIG. 4 illustrates a specific detailed embodiment in accordance with the present invention showing detailed parameter values.

FIG. 4 illustrates a particularly advantageous embodiment of the protection circuit 100 of FIG. 1. Although it may not be readily apparent, the circuit 400 of FIG. 4 is analogous to a specific implementation of the circuit of FIG. 2D except that no transistor 281 is required. Instead, the operational amplifier drives the gate terminal of transistor 231. Accordingly, the circuit of FIG. 4 will be described with frequent reference to the circuit of FIG. 2D. The circuit of FIG. 4 is illustrated in some detail including particular transistor width to length ratios. The transistors with the double bar at their drain are high-voltage transistors, which can be implemented in a variety of ways, in some of them without adding more cost or processing steps to the wafers. For example, these transistors may be extended-drain devices, which allow the drain voltage to be considerably higher or lower (for example, up to 20 or 40V) than at the other MOSFET terminals. Accordingly, the high-voltage transistors allow a higher magnitude of overvoltage or reverse-battery protection.

The circuit 400 includes input terminals 401 and 402 and output terminals 411 and 412, which are similar to input terminals 101 and 102 and output terminals 111 and 112, respectively, of FIG. 2D. The circuit also includes an operational amplifier 482 that replaces the amplifier 282D as well as the transistor 281 of FIG. 2D. The bias circuit 490 operates to generate bias voltages that are useful throughout the operational amplifier. The reference voltage 483 is supplied and is analogous to the reference voltage 283D of FIG. 2D. The combination of the operational amplifier 482 and the reference voltage 483 is an example of the current application circuit 160 illustrated in FIG. 1.

The circuit 400 also includes transistor 450 that is operating in the triode region. The transistor 450 is an example of the voltage-current dependent circuit 150 of FIG. 1. The transistor 431 is analogous to the transistor 231 of FIG. 2D and to the transistor 131 of FIG. 1. The resistor 440 is analogous to the resistor 140 of Figure and FIG. 1. The intrinsic diode 480 is analogous to the intrinsic diode 280 of FIG. 2D. The resistors 487 and 486 are analogous to the resistors 287 and 286, respectively, of FIG. 2D.

The capacitor 488 is an internal compensation capacitor and, together with any external decoupling capacitor (not shown) is equivalent to the capacitor 288 of FIG. 2D. Since the capacitance of the capacitor 488 is quite small, however, the decoupling capacitor will contribute most of the decoupling capacitance used to smooth out supply noise and smooth out transients.

The circuit 400 is advantageous because the feedback loop from output terminal 411 through resistor 487 to the gate terminal of transistor 491 (and from the output terminal 412 through resistor 486 to the gate terminal of transistor 491) causes the circuit 400 to regulate the applied voltage between output terminals 411 and 412 to be only a certain acceptable applied voltage, even during an overvoltage condition. This is important for application in which continuous power is desired even during the application of an overvoltage condition from the power supply.

The circuit helps protect against harmful currents generated due to a reverse voltage condition as well. Under normal operation, the p-type bulk of the wafer is coupled to ground or another low voltage supply, while the n-well that forms the substrate of the pMOS pass transistor 431 is coupled to the high voltage supply. However, during a reverse voltage condition that occurs such as when a battery is connected in reverse, these supplied voltages are reversed. Accordingly, the p-bulk is coupled to the high voltage supply, while the n-well is connected to the low voltage supply. That creates a forward-biased diode from the p-bulk to the n-well. Since the n-well's connection to the supply terminal 401 normally has low resistivity, the reverse voltage condition can produce large amounts of current that can damage or destroy the PMOS transistor 431. In accordance with the principles of the present invention, the resistor 440 is provided in this path. Accordingly, the current flow from the p-bulk to the n-well of the pass transistor 431 and from there to the supply terminal 401 is significantly reduced to levels that are more likely to be below harmful levels. Similarly, the same or other protection resistors may be used to limit the current flow across the n-wells of other PMOS transistors connected to the supply terminal 401.

The circuits of the present invention are also advantageous in that no devices such as bipolar transistors, zener diodes, Schottky diodes, or depletion mode transistors are needed. Accordingly, there is an abundance of available CMOS processes that may be used to fabricate the circuits on a semiconductor substrate, even on the same substrate that the load circuit itself is fabricated on. In addition, the voltage drop across the protection circuit in accordance with the present invention may be made quite small since no diodes or bipolar transistors are used to pass power to the load circuit. Furthermore, the embodiments of FIGS. 2B, 2D, 3B, 3D, and 4 do not require bulky and complex oscillator and charge pump circuits, which can significantly increase cost and power consumption.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. An electrical voltage protection circuit having at least one input terminal configured to receive an input voltage applied from a voltage source during operation, the protection circuit further having at least one output terminal, the protection circuit configured to provide an output voltage on the output terminal during operation, the protection circuit comprising the following:

a field-effect transistor having a gate terminal, a source terminal, a drain terminal, and a body terminal, the source terminal of the field-effect transistor being coupled to an input terminal of the protection circuit, the drain terminal of the field-effect transistor being coupled to an output terminal of the protection circuit;

a resistor coupled between the source terminal and the body terminal of the field-effect transistor;

a voltage-current dependent circuit coupled between the gate terminal and the source terminal of the field-effect transistor, the voltage-current dependent circuit configured to apply a voltage difference between the gate terminal and the source terminal that is dependent on the current passing through the voltage-current dependent circuit; and a current application circuit coupled to the voltage-current dependent circuit and configured to apply a current through the voltage-current dependent circuit such that in at least some conditions when an overvoltage is not present, the voltage-current dependent circuit applies a voltage at the gate terminal of the field-effect transistor sufficient to turn or keep the field-effect transistor on.

2. A protection circuit in accordance with claim 1, wherein the voltage-current dependent circuit comprises a resistor.

3. A protection circuit in accordance with claim 1, wherein the voltage-current dependent circuit comprises a diode.

4. A protection circuit in accordance with claim 1, wherein the field-effect transistor is a first field-effect transistor, wherein the voltage-current dependent circuit comprises a channel region of a second field-effect transistor configured to operate in the triode or in the saturation region.

5. A protection circuit in accordance with claim 1, wherein the input terminal is a first input terminal, and the output terminal is a first output terminal, the protection circuit further comprising a second input terminal and a second output terminal.

6. A protection circuit in accordance with claim 5, wherein the field-effect transistor is a first field-effect transistor, wherein the current application circuit comprises the following:

a second field effect transistor having a source terminal coupled to the second input terminal and to the second output terminal, the drain terminal of the second field-effect transistor coupled to the gate terminal of the first field-effect transistor, the second field effect transistor also having a gate terminal.

7. A protection circuit in accordance with claim 6, wherein the current application circuit further comprises the following:

a comparator having a first input terminal connected to a reference voltage source, and having a second input terminal coupled to a node that is configured to carry a voltage during operation that is substantially proportional to the differential voltage applied between the first and second input terminals.

8. A protection circuit in accordance with claim 7, wherein the second input terminal of the comparator is coupled to whichever of the first or second input terminal is configured to carry a higher voltage during normal operation.

9. A protection circuit in accordance with claim 7, wherein the resistor is a first resistor, the protection circuit further comprising the following:

a second and third resistor coupled in series between the first and second input terminals of the protection circuit, wherein the second input terminal of the comparator is coupled to the node between the second and third resistors.

10. A protection circuit in accordance with claim 6, wherein the first field-effect transistor is a pMOSFET and the second field-effect transistor is an nMOSFET.

11. A protection circuit in accordance with claim 6, wherein the first field-effect transistor is an nMOSFET and the second field-effect transistor is a pMOSFET.

12. A protection circuit in accordance with claim 6, wherein the current application circuit further comprises the following:

an operational amplifier having a first input terminal connected to a reference voltage source, and having a second input terminal coupled to a node that is configured to carry a voltage during operation that is substantially proportional to the differential voltage between the first and second output terminals.

13. A protection circuit in accordance with claim 12, further comprising the following:

a capacitor coupled between the first and second output terminals of the protection circuit.

14. A protection circuit in accordance with claim 13, wherein the second input terminal of the comparator is coupled to a node that is configured to carry a voltage equal to the difference between the first and second output terminals of the protection circuit.

15. A protection circuit in accordance with claim 13, wherein the second input terminal and the second output terminal are forced at the same voltage.

16. A protection circuit in accordance with claim 5, wherein the current application circuit comprises the following:

an operational amplifier having a first input terminal connected to a reference voltage source, and having a second input terminal coupled to a node that is configured to carry a voltage during operation that is substantially proportional to the differential voltage between the first and second output terminals.

17. A protection circuit in accordance with claim 16, wherein the second input terminal of the operational amplifier is coupled to whichever of the first or second output terminals of the protection circuit is configured to carry a higher voltage during a normal operation.

18. A protection circuit in accordance with claim 16, wherein the resistor is a first resistor, the protection circuit further comprising the following:

a second and third resistor coupled in series between the first and second output terminals of the protection circuit.

19. A protection circuit in accordance with claim 1, wherein the field-effect transistor is an enhancement mode field effect transistor.

* * * * *

UNITED STATES PATENT AND TRADEMARK OFFICE
CERTIFICATE OF CORRECTION

PATENT NO. : 6,882,513 B2
DATED : April 19, 2005
INVENTOR(S) : J. Marcos Laraia

It is certified that error appears in the above-identified patent and that said Letters Patent is hereby corrected as shown below:

Column 1,
Line 48, change "usual" to -- unusual --.

Column 4,
Line 21, after "two input" change "terminal" to -- terminals --.

Column 5,
Line 45, after "FIG. 4" change "illustrates" to -- illustrate --.

Column 6,
Line 24, before "a node" insert -- to --.

Column 7,
Line 48, before "and FIG. 1." insert -- 2D --.
Line 67, change "application" to -- applications --.

Column 10,
Line 45, after "protection circuit" insert -- that --.

Signed and Sealed this

Fourth Day of October, 2005

JON W. DUDAS
*Director of the United States Patent and Trademark Office*